US 6,638,876 B2

(12) United States Patent
Levy et al.

(10) Patent No.: US 6,638,876 B2
(45) Date of Patent: Oct. 28, 2003

(54) METHOD OF FORMING DIELECTRIC FILMS

(75) Inventors: Sagy Levy, Sunnyvale, CA (US); Robin S. Bloom, Petaluma, CA (US); Avashai Kepten, Bikat Bet Hakerem (IL)

(73) Assignee: Mattson Technology, Inc., Fremont, CA (US)

( * ) Notice: Subject to any disclaimer, the term of this patent is extended or adjusted under 35 U.S.C. 154(b) by 73 days.

(21) Appl. No.: 09/957,697

(22) Filed: Sep. 19, 2001

(65) Prior Publication Data
US 2002/0142624 A1 Oct. 3, 2002
(Under 37 CFR 1.47)

Related U.S. Application Data
(60) Provisional application No. 60/233,740, filed on Sep. 19, 2000.

(51) Int. Cl.[7] ................................................ H01L 71/31
(52) U.S. Cl. ........................ 438/769; 438/770; 438/775; 438/786
(58) Field of Search ................................ 438/769, 770, 438/775, 776, 786, 787

(56) References Cited

U.S. PATENT DOCUMENTS

| | | | |
|---|---|---|---|
| 4,585,492 A | 4/1986 | Weinberg et al. | |
| 5,210,056 A | 5/1993 | Pong et al. | |
| 5,578,848 A | 11/1996 | Kwong et al. | |
| 5,880,040 A | 3/1999 | Sun et al. | |
| 6,020,024 A | * 2/2000 | Maiti et al. | 257/21.193 |
| 6,121,130 A | * 9/2000 | Chua et al. | 438/623 |
| 6,136,725 A | 10/2000 | Loan et al. | |
| 6,165,834 A | 12/2000 | Agarwal et al. | |
| 6,168,980 B1 | 1/2001 | Yamazaki et al. | |
| 6,177,363 B1 | 1/2001 | Roy et al. | |
| 6,191,011 B1 | 2/2001 | Gilboa et al. | |
| 6,258,690 B1 | 7/2001 | Zenke | |
| 6,274,454 B1 | 8/2001 | Katori | |
| 6,287,897 B1 | 9/2001 | Gousev et al. | |
| 6,291,867 B1 | * 9/2001 | Wallace et al. | 257/410 |
| 6,300,203 B1 | 10/2001 | Buynoski et al. | |
| 6,306,742 B1 | 10/2001 | Doyle et al. | |
| 6,326,231 B1 | * 12/2001 | Subramanian et al. | 438/787 |
| 6,326,258 B1 | 12/2001 | Iizuka | |
| 6,333,557 B1 | 12/2001 | Sullivan | |
| 6,335,049 B1 | 1/2002 | Basceri | |
| 6,337,289 B1 | 1/2002 | Narwankar et al. | |
| 6,338,996 B1 | 1/2002 | Iizuka | |
| 6,451,713 B1 | * 9/2002 | Tay et al. | 438/791 |

OTHER PUBLICATIONS (High–Quality Ultrathin CVD Si3N4 Gate Dielectrics Fabricated by Rapid Thermal Process); (*Ultrathin SiO2 and High–K Materials for ULSI Gate Dielectrics: Symposium Held Apr. 5–8, 1999 San Francisco, California, USA*); S.C. Song, H.F. Luan, M. Gardner, J. Fulford, M. Allen, and D.L. Kwong, p. 83–33, Materials Research Society (Nov. 1, 1999).

* cited by examiner

Primary Examiner—Kevin M. Picardat
(74) Attorney, Agent, or Firm—Dority & Manning, P.A.

(57) ABSTRACT

A method for depositing a high-k dielectric coating onto a substrate, such as a semiconductor wafer, is provided. In one embodiment, the process is directed to forming a nitride layer on a substrate. In an alternative embodiment, the present invention is directed to forming a metal oxide or silicate on a semiconductor wafer. When forming a metal oxide or silicate, a passivation layer is first deposited onto the substrate.

33 Claims, 14 Drawing Sheets

METHOD OF FORMING DIELECTRIC FILMS

RELATED APPLICATIONS

The present application is based on and claims priority to a Provisional Application filed on Sep. 19, 2000 having Application No. 60/233,740.

BACKGROUND OF THE INVENTION

For forming Complementary Metal Oxide Semiconductor (CMOS) devices, MOSFET (Metal Oxide Semiconductor Field Effect Transistor) devices or high memory devices, such as DRAMs (Dynamic Random Access Memories), it is often necessary to form a thin, high dielectric constant (high-k) coating onto a substrate, such as a silicon wafer. A variety of techniques have been developed to form such thin films on a semiconductor wafer.

In the past, gate dielectric layers have been formed from silicon dioxide. The scaling down of the above-described devices, however, has increased the demand for gate dielectrics with a higher dielectric constant than silicon dioxide. This is necessary to reach ultra thin oxide equivalent thickness (less than 20 Å) without compromising gate leakage current. In one embodiment, those skilled in the art have explored the possibility of using a nitride layer in place of traditional silicon dioxide layers.

For instance, in one conventional method of forming a dielectric film, an oxynitride layer is first formed on the substrate and then annealed in an oxygen-containing or inert atmosphere to produce the dielectric layer. For example, one such conventional method is described in U.S. Pat. No. 5,880,040 to Sun, et al. In particular, Sun, et al. describes a method for manufacturing a dielectric layer that includes exposing the heated surface of a silicon substrate to $N_2O$ to cause the growth of a layer of $SiO_2$ on the surface, which incorporates a concentration of nitrogen in the layer. Next, the layer is heated and exposed to NO to cause formation of silicon-to-nitrogen bonds in an interfacial region between the layer of $SiO_2$ and the silicon substrate. The layer is then annealed in the presence of an inert gas, such as nitrogen.

Although this method may possess some benefits, the dielectric constant "k" of the resulting film is often not large enough for certain applications due to the relatively low nitrogen content therein.

Additional methods have also been developed. For instance, another conventional method known as a gate stack involves the formation of a dielectric film in which a base oxide layer is formed on the silicon substrate followed by the deposition of a gate dielectric and subsequently by a gate contact material. One problem which has been identified for the gate stack is the projected oxide thicknesses of less than 2 nm for the 100 nm technology node and less than 1 nm for the 50 nm node. Conventional silicon dioxide is believed not to be scaleable to such dimensions with acceptable gate leakage due to tunneling currents. Projected tunneling currents for silicon dioxide at such thickness ranges is expected to be several orders of magnitude too large. Materials with high dielectric constants are needed to achieve reduced tunneling currents.

As such, a need currently exists for improved methods of depositing a high-k coating onto a substrate.

SUMMARY OF THE INVENTION

In accordance with one embodiment of the present invention, a method for depositing a dielectric coating onto a substrate is provided that includes a system comprising a reactor vessel adapted to contain the substrate and an energy source in communication with the reactor vessel for heating the substrate. For example, in one embodiment, the substrate can be a semiconductor wafer.

While in the reactor vessel, a nitride film having a dielectric constant greater than about 4 can be formed on the substrate. For example, one method for forming the film can include the following:

a) heating the substrate to an oxide deposition temperature with the energy source.

b) supplying to the reactor vessel an oxide gas while the substrate is at the oxide deposition temperature. The oxide gas comprises a compound that contains at least one nitrogen atom such that the oxide gas reacts with the substrate to form an oxynitride layer on the substrate. For example, in some embodiments, the nitrogen-containing compound is selected from the group consisting of NO, $N_2O$, $NO_2$, and combinations thereof.

c) depositing a nitride layer on the oxynitride layer while the substrate is maintained at a nitride deposition temperature. For example, in some embodiments, the nitride layer can be deposited by supplying a first gas precursor and a second gas precursor to the reactor vessel. In some embodiments, the first gas precursor comprises a compound that contains at least one silicon atom (e.g., $SiH_4$, $SiH_3$, $SiH_2Cl_2$, etc.) and the second gas precursor comprises a compound that contains at least one nitrogen atom (e.g., $NH_3$, $N_2O$, etc.).

The method of forming the film can also include annealing the nitride layer in the presence of a nitridation annealing gas (e.g. $NH_3$), as well as annealing the nitride layer in the presence of an oxide annealing gas (e.g. $N_2O$).

In one embodiment, in order to minimize surface roughness of the formed layer, the oxynitride layer can be formed so as to have a thickness of less than 10 angstroms.

Further, the nitride layer can be deposited at a temperature of less than about 750° C., while the nitride layer can then be annealed in the presence of an oxide annealing gas at a temperature greater than 770° C. The formed nitride layer can have a thickness of less than about 25 angstroms.

In order to form a thin oxynitride layer prior to nitride deposition, the oxynitride layer can be formed in an atmosphere having a pressure less than about 50 Torr, and particularly less than about 25 Torr.

As described above, besides annealing the nitride layer in the presence of an oxide annealing gas, the nitride layer is also annealed in the presence of a nitridation annealing gas. When annealed in the presence of a nitridation annealing gas, the temperature can be from about 875° C. to about 925° C.

The nitride layer can be used in various devices. For instance, the nitride layer can be incorporated into a capacitor or into a transistor.

In an alternative embodiment, instead of forming a nitride layer, the present invention is directed to forming a metal oxide or silicate layer on a semiconductor wafer. In this embodiment, the method of the present invention includes heating a wafer comprising silica in the presence of a gas containing nitrogen to form a passivation layer on the wafer. The gas containing nitrogen can be ammonia. The passivation layer can have a thickness of less than about 5 nanometers, and particularly less than 1 nanometer. The passivation layer can be formed in less than about 10 seconds at a temperature from about 600 to about 900° C. The partial pressure of the gas containing nitrogen during formation of the passivation layer can be less than about 100 Torr.

In accordance with the present invention, the passivation layer is formed in order to prevent later formation of oxide layers.

After forming the passivation layer, the wafer can be heated in the presence of a gas precursor to form a dielectric layer comprising a metal oxide or a silicate. The dielectric layer can be formed at a temperature greater than about 300° C., and particularly at a temperature of from about 400° C. to about 800° C. The gas precursor can have a partial pressure of less than about 100 Torr during formation of the dielectric layer. The dielectric layer can be, for instance, $HfO_2$, $ZrO_2$, $Al_2O_3$, $Ta_2O_5$, $La_2O_5$ or their silicates.

After forming the dielectric layer, the wafer can be annealed in the presence of an annealing gas. The annealing gas can include an inert gas and an oxygen-containing gas. The annealing gas can be, for instance, nitrogen, argon, or mixtures thereof. The oxygen-containing gas, on the other hand, can be NO, $N_2O$, $O_2$, or mixtures thereof.

Once formed, the dielectric layer can have an EOT of less than 1.2 nanometers. The dielectric layer can be used in various devices. In one embodiment, a polysilicon layer can then be deposited on top of the dielectric layer.

All of the processes of the present invention can be carried out in a rapid thermal processing chamber in which the wafer is heated rapidly to high temperatures. All of the layers can be formed during separate heating cycles as desired.

Other features and aspects of the present invention are discussed in greater detail below.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures in which.

Figure 1:
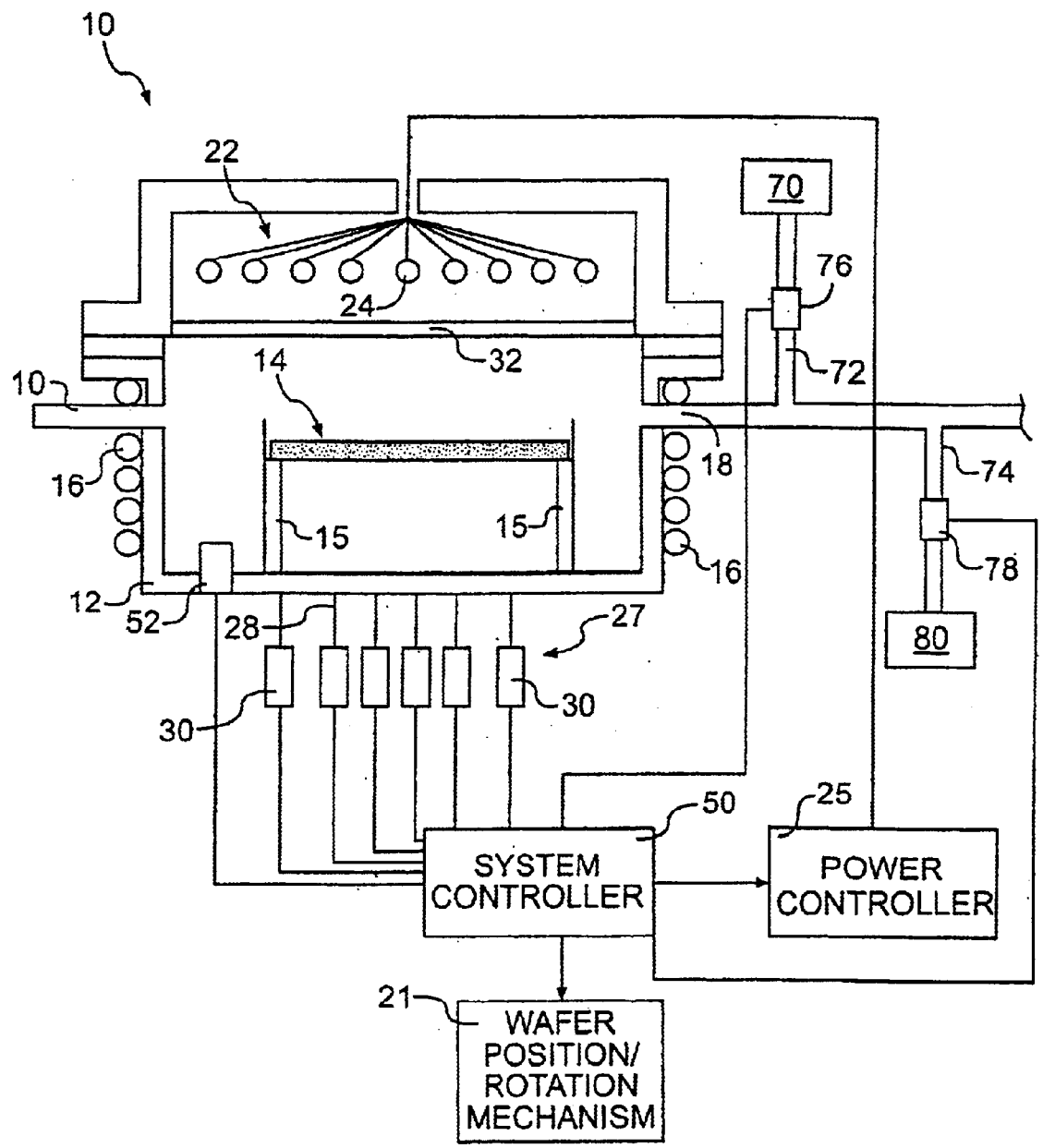
FIG. 1 is a cross-sectional view of a rapid thermal chemical vapor deposition system that can be utilized in one embodiment of the present invention.

Repeat use of reference characters in the present specification and drawings is intended to represent same or analogous features or elements of the invention.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present invention, which broader aspects are embodied in the exemplary construction.

The present invention is generally directed to a method of depositing a coating having a relatively high dielectric constant "k" onto a substrate. For instance, the dielectric constant of the coating formed according to the present invention is typically greater than about 4, in some embodiments, greater than about 10, and in some embodiments, greater than about 15. For instance, coatings formed according to the present invention might have a dielectric constant between about 5 to about 100, and in some embodiments, between about 15 to about 20. Further, the resulting high-k coating can generally have a thickness less than about 30 nanometers. For instance, when forming devices, the resulting thickness is typically between about 1 to about 20 nanometers, and in some embodiments, between about 1 to about 10 nanometers.

As will be described in more detail below, the present invention is generally directed to the formation of gate dielectric layers having a high dielectric constant. Various devices, such as CMOS devices can be produced according to the present invention having a small EOT. In one embodiment, the present invention is directed to forming a nitride stack, in particular a $Si_3N_4/SiO_2$ stack for a gate dielectric application. In an alternative embodiment, the present invention is directed to depositing a high-K metal oxide or silicate coating on a semiconductor wafer in forming a gate dielectric. The metal oxide or silicate coating formed according to the present invention is compatible with conventional self-aligned dual-gate poly-Si CMOS technology, with minimal formation of interfacial oxide layers that degrade device performance and reliability. The device is fabricated having low EOT values and reduced leakage current.

In general, any chamber or vessel that is capable of being utilized to deposit a dielectric coating onto a substrate can be utilized in the present invention. For example, conventional chemical vapor deposition vessels can be adapted for use with the method of the present invention. It should be understood, however, that other vessels used in other techniques can also be used in the present invention, such as vessels utilized in physical vapor deposition, plasma enhanced chemical vapor deposition, sputtering, and the like.

Referring to FIG. 1, one particular embodiment of a system 10 that utilizes chemical vapor deposition to deposit the dielectric coating onto a substrate is illustrated. As shown, the system 10 includes a reactor vessel 12 adapted to receive substrates, such as a semiconductor wafer 14. As shown, the wafer 14 is positioned on a substrate holder 15 made from a thermal insulating material, such as quartz. During processing, the substrate holder 15, in one embodiment, can be adapted to rotate the wafer 14 using a wafer rotation mechanism. Rotating the wafer 14 may promote better temperature uniformity over the surface of the wafer 14 and may promote enhanced contact and gas uniformity between the wafer 14 and gases introduced into the reactor vessel 12. It should be understood, however, that besides wafers, the reactor vessel 12 is also adapted to process other substrates, such as optical parts, films, fibers, ribbons, etc.

The reactor vessel 12 is designed to heat the wafer 14 at very rapid rates and under carefully controlled conditions. The reactor vessel 12 can be made from various materials, including, for example, metals and ceramics. For instance, in some embodiments, the reactor vessel 12 can be made from stainless steel or quartz. When the reactor vessel 12 is made from a heat conductive material, it typically includes a cooling system. For instance, as shown in FIG. 1, the reactor vessel 12 includes a cooling conduit 16 wrapped around the perimeter of the reactor vessel 12 or contained within holes of the reactor vessel 12.

As shown, an energy source 22 is also provided in the apparatus 10. In particular, the energy source 22 is placed into communication with the reactor vessel 12 for emitting energy to heat the wafer 14 during processing. In general, a variety of heating devices can be utilized as the energy source 22. For example, the energy source 22 can contain lights, lasers (e.g., a nitrogen laser), ultraviolet radiation heating devices, arc lamps, vapor lamps such as mercury that have a high ultraviolet light output, flash lamps, infrared radiation devices, electrical resistant heaters, combinations thereof, and the like. Moreover, the spectral shape and/or certain properties (e.g., intensity, polarization, continuous and/or pulsed emission radiation) of the energy source 22 can be varied to adapt to a particular process. For instance, the spectral shape of the energy source 22 can be controlled as a function of time and/or as a function of a property of the wafer 14 or film(s) on the wafer 14 (e.g., temperature of the film(s) and/or the wafer 14, the thickness of a film being deposited on the wafer 14, or any other physical or chemical parameter of the film(s) or the wafer 14).

In the illustrated embodiment, for example, the energy source 22 includes a plurality of lamps 24. The lamps 24 can be incandescent lamps, such as tungsten-halogen lamps. The energy source 22 can also include a reflector or a set of reflectors for uniformly directing energy being emitted by the lamps 24 onto the wafer 14. As shown in FIG. 1, the lamps 24 are placed above the wafer 14. It should be understood, however, that the lamps 24 may be placed at any particular location. For example, lamps may be utilized above and/or below the wafer 14. Further, additional or less lamps can be included within the system 10 if desired.

The system 10 can also include a window 32 positioned between the energy source 22 and the wafer 14 that is capable of allowing energy at a preselected wavelength to pass therethrough. For example, the window 32 can, in some embodiments, act as a filter by allowing certain wavelengths of light to pass therethrough, while absorbing other wavelength(s). In addition, the window 32, in some embodiments, may not act as a filter.

In order to monitor the temperature of the wafer 14 during a heating cycle, the reactor vessel 12 can, in one embodiment, includes a plurality of radiation sensing devices 27. The radiation sensing devices 27 can include, for example, a plurality of optical fibers, lenses, light pipes, etc. For example, in the illustrated embodiment, the radiation sensing devices include light pipes 28 that are in communication with a plurality of corresponding temperature detectors 30. In one embodiment, for example, the optical fibers 28 are configured to receive thermal energy being emitted by the wafer 14 at a particular wavelength. The amount of sensed radiation is then communicated to temperature detectors 30, which generate a usable voltage signal for determining the temperature of the wafer that can be calculated based, in part, on Planck's Law. In one embodiment, each optical fiber 28 in combination with a temperature detector 30 comprises a pyrometer. In another embodiment, the optical fibers 28 are routed to a single but multiplexing radiation-sensing device.

Besides using radiation-sensing devices, other temperature sensing devices may also be used in the system of the present invention. For instance, one or more thermocouples may be incorporated into the system for monitoring the temperature of the wafer 14 at a single location or at a plurality of locations. The thermocouples can be placed in direct contact with the wafer 14 or can be placed adjacent the wafer 14 from which the temperature can be extrapolated.

The reactor vessel 12 also includes at least one an inlet 18 for introducing one or more gases into the vessel to form the dielectric coating on the wafer 14. For example, as shown, the inlet 18 can be in communication with a gas supply 70 via a line 72 and a gas supply 80 via a line 74 for providing two or more separate gases to the reactive vessel 12. In one embodiment, a showerhead can be connected to the gas inlet for dispersing gases over the wafer. The reactor vessel 12 also includes at least one outlet 20 for evacuating gases from the vessel 12 after a certain period of time. It should also be understood that, although only one inlet 18 and outlet 20 are illustrated, the vessel 12 may contain any number of inlets and outlets for supplying the vessel with gases.

In one embodiment, the reactor vessel can include a gate valve, such as a gate valve purchased from VAT, which isolates the chamber from the handling side. A vacuum within the chamber can be achieved using a mechanical rough pump. The pressure can be controlled by a valve. High vacuums of less than $10^{-3}$ Torr can be obtained by the use of a turbomolecular pump.

Formation of a Nitride Stack

Figure 2:
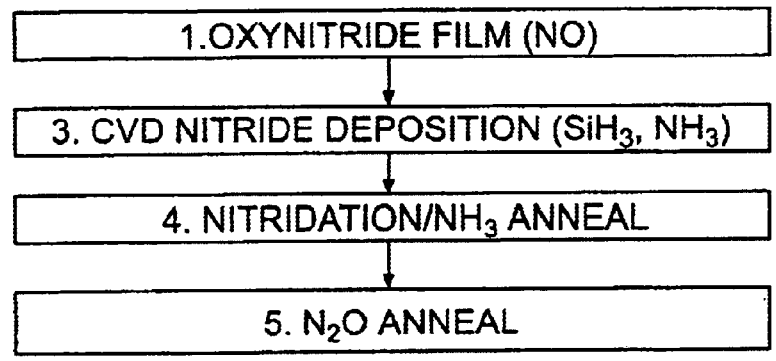
FIG. 2 is a flow diagram of one embodiment of the method of the present invention.

Referring to FIG. 2, one embodiment of the method of the present invention for forming a dielectric coating of nitride on the wafer 14 using the chemical vapor deposition system shown in FIG. 1 will now be described in more detail. It should be understood, however, that other systems and other deposition techniques can also be used in the method of the present invention. For example, one suitable chemical vapor deposition system may be described in U.S. Pat. No. 6,136,725 to Loan, et al., which is incorporated herein in its entirety by reference thereto for all purposes.

Initially, the wafer 14 is heated to a certain oxide deposition temperature using the energy source 22. While the wafer 14 is maintained at the desired oxide deposition temperature, an oxide gas is supplied to the reactor vessel 12 via the inlet 18 for a certain deposition time period and at a certain flow rate. For example, as shown in FIG. 1, one or more oxide gases can be supplied to the gas inlet 18 from a gas supply 70 via line 72. The oxide gas flow rate can vary, but is typically between about 50 standard cubic centimeters per minute to about 10 standard liters per minute. Moreover, in one embodiment, the oxide gas is supplied for an average of about 10 seconds. A thickness of the formed layer can be from about 15 Angstroms or less (e.g., 10 Angstroms or less).

A variety of oxide gases can be utilized in the present invention. In particular, any oxide gas that is capable of forming a base oxide layer having a relatively high dielectric constant on the wafer can be utilized in the present invention. For example, some suitable oxide gases include gases that also contain nitrogen, such as nitrogen oxide (NO), nitrous oxide ($N_2O$), nitric oxide ($NO_2$), and the like. Thus, when utilizing a nitrogen-containing oxide gas, such as mentioned above, the base oxide layer that is formed is generally an oxynitride structure having the generic formula, $SiO_xN_y$.

Moreover, the particular oxide deposition temperature can vary based on the substrate utilized, the oxide gases utilized, and/or the desired characteristics of the deposited coating. For instance, the oxide deposition temperature is typically relatively low so that the thickness of the base oxide layer is minimized (6 to 9 Anstroms), thereby increasing the dielectric constant of the resulting film. For example, when depositing the base oxide layer onto a silicon wafer, the temperature of the wafer is typically maintained at less than about 1100° C., in some embodiments between 600° C. to about 1100° C., in some embodiments less than about 750° C., in some embodiments between about 600° C. to about 750° C., and in one embodiment, about 700° C. Moreover, the reactor vessel pressure during oxynitride deposition is typically between about 1 Torr to about 760 Torr.

In the embodiments described above, the nitrogen content present within the base oxide layer can significantly increase the dielectric constant of the layer, thereby enhancing the electrical characteristics of the resulting device. It has been discovered that in order to increase the nitrogen content, the pressure of the oxidation step should be decreased. Thus, in order to increase nitrogen content, the pressure should be less than 100 Torr, particularly less than 50 Torr, and more particularly less than 25 Torr.

In this embodiment of the present invention, a nitride layer is deposited on the base oxide layer. In general, any well-known nitride deposition techniques, such as chemical vapor deposition, can be utilized in the present invention. For instance, one suitable chemical vapor deposition technique may be described in U.S. Pat. No. 6,177,363 to Roy, et al., which is incorporated herein in its entirety by reference thereto for all purposes. Moreover, in one embodiment, the chemical vapor deposition of FIG. 1 can be utilized to deposit the nitride layer onto the wafer. For example, one or more nitride precursor gases may be supplied to the reactor vessel 12 via the inlet 18 for a certain time period and at a certain flow rate. In one embodiment, as shown in FIG. 1, one nitride precursor gas is supplied to the gas inlet 18 from one gas supply (not shown) via line 74, while the other precursor gas is supplied to the gas inlet 18 from another gas supply (not shown). The nitride precursor gas flow rates can vary, but are typically between about 50 standard cubic centimeters per minute to about 10 standard liters per minute. Moreover, in one embodiment, the nitride precursor gases are supplied until a thickness of about 20 Angstroms is reached (typically 25-50 seconds).

In general, any of a variety of gas precursors that are capable of forming a nitride layer can be utilized in the present invention. For example, one nitride gas precursor can contain silicon (e.g., $SiH_3$, $SiH_2Cl_2$, $SiH_4$ etc.), while another gas precursor can contain nitrogen (e.g., $NH_3$, etc.). Thus, for example, a $SiH_4$ gas precursor and a $NH_3$ gas precursor can react on the surface of a wafer to form a nitride layer having the formula, $Si_3N_4$.

During the nitride deposition time period, the wafer 14 is maintained at a certain temperature by the energy source 22. For example, the nitride deposition temperature can be less than about 900° C., and in some embodiments between 600° C. to about 750° C. In one embodiment, it has been discovered that maintaining the temperature less than about 750° C. can lower the roughness of the resulting layer. Moreover, the reactor vessel pressure during supply of the nitride precursor gases is typically less than about 760 Torr, and in some embodiments, less than about 100 Torr.

After the nitride coating is formed, it is then exposed to one or more additional annealing gases to increase the nitrogen content, remove hydrogen, and reduce the defects of the layer. For example, as shown in FIG. 1, after the desired nitride deposition time period, the nitride gases can be removed from the reactor vessel 12 via an outlet 20 using a pump (not shown). A nitrogen-containing annealing gas (e.g., $NH_3$) may then be supplied to the reactor vessel 12 via the inlet 18 for a certain time period and at a certain flow rate to increase the nitrogen content of the nitride layer. The nitrogen-containing annealing gas flow rate can vary, but is typically between about 50 standard cubic centimeters per minute to about 10 standard liters per minute.

During the nitridation annealing time period, the wafer 14 is heated by the energy source 22 to a certain nitridation temperature. For example, in some embodiments, the nitridation temperature of the wafer 14 can be less than about 1100° C. and in some embodiments between 600° C. to about 1100° C. The present inventors have discovered that lowering the temperature of the nitridation annealing can lower the surface roughness. In this regard, in order to reduce roughness, the temperature should be less than about 900° C., and particularly less than about 850° C. In order to maximize nitrogen content, on the other hand, the temperature should be in a range of from about 875° C. to about 925° C., and particularly at a temperature of about 905° C. The reactor vessel pressure during supply of the nitrogen-containing annealing gas is typically between about 1 Torr to about 760 Torr, and in one embodiment, about 500 Torr.

Once annealed with the nitridation gas, the nitride layer can then be annealed with an oxide gas to remove hydrogen from the layer. For example, as shown in FIG. 1, after the desired nitridation annealing time period, the nitrogen-containing annealing gases can be removed from the reactor vessel 12 via an outlet 20 using a pump (not shown). An oxide annealing gas (e.g., $N_2O$, NO, etc.) may then be supplied to the reactor vessel 12 via the inlet 18 for a certain time period and at a certain flow rate. The oxide annealing gas flow rate can vary, but is typically between about 50 standard cubic centimeters per minute to about 10 standard liters per minute.

During the oxide annealing time period, the wafer 14 is heated by the energy source 22 to a certain oxide temperature. For example, in some embodiments, the oxide annealing temperature of the wafer 14 is less than about 1100° C. and in some embodiments between 600° C. to about 1100° C. In order to decrease roughness, the oxide annealing temperature should be higher, such as greater than 750° C. In order to increase or maximize nitrogen content, however, the temperature should be lower, particularly less than about 700° C. The reactor vessel pressure during supply of the oxide annealing gas is typically between about 1 Torr to about 760 Torr, and in one embodiment, about 500 Torr.

If desired, various parameters of the method described above may also be controlled in order to produce a dielectric coating having certain preselected characteristics. In order to control the deposition and annealing conditions, a variety of mechanisms can be utilized. For example, in one embodiment of the present invention, as shown in FIG. 1, the system 10 can include a system controller 50 that is capable of receiving input signals from various components of the system 10 or from an operator and, based on these signals, controlling a particular parameter of the system 10. The controller 50 can be a programmable logic computer (PLC), such as an Allen-Bradley Controllogix Processor, although any other controller suitable for controlling the system 10 described above, is generally acceptable. Alternately, hard-wired circuitry, relays, software, etc., could be substituted for the PLC and used as the controller 50.

For example, in one embodiment, the system controller 50 receives voltage signals from the temperature detectors 30 that represent the radiation amounts being sampled at the various locations. Based on the signals received, the controller 50 is configured to calculate the temperature of the wafer 14 at different locations. In addition, the system controller 50, as shown in FIG. 1, can also be in communication with a lamp power controller 25. In this arrangement, the controller 50 can determine the temperature of the wafer 14, and, based on this information, control the amount of thermal energy being emitted by the energy source 22. In this manner, relatively instantaneous adjustments can be made regarding the conditions within the reactor vessel 12 for processing the wafer 14 within carefully controlled limits.

For instance, as described above, the system controller 50 can be utilized in conjunction with the temperature detectors 30 and the energy source 22 to adjust the temperature within the reactor vessel 12 to a predetermined deposition or annealing temperature. The temperature may also be automatically adjusted after a preset deposition or annealing time period. Moreover, the deposition or annealing temperature can also be varied using the controller 50 for one or more cycles, such as described above.

The controller 50 can also be used to automatically control other components of the system 10. For instance, the controller 50 can be used to control the flow rate of gases entering the reactor vessel 12 through the gas inlet 18. As shown, the system controller 50 can be in communication with valves 76 and 78 (e.g., solenoid valves) for controlling the flow rate of gases from the gas supplies 70 and 80, respectively. For example, in some embodiments, the controller 50 can be configured to receive temperature measurements from the temperature detectors 30. Thus, when a certain temperature is reached during a particular reaction cycle, as described above, the system controller 50 can cause the valves 76 and/or 78 to be opened to provide one or more gases to the reactive vessel 12 at a predetermined flow rate. The system controller can adjust the flow rate of the gases based on various input signals from the system 10 or from a programmer.

After forming the nitride stack ($Si_3N_4/SiO_2$) as described above, the stack can be used in various devices as described above, such as MOS capacitors in transistors. In one embodiment, after forming the stack, polysilicon deposition and $POCL_5$ doping can take place. Further, in PMOS wafers, boron ion implant can be performed using $BH_3$ followed by an anneal. When used in transistor structures, the above-described stack has shown excellent leakage current of 4 e-3A/$cm^2$@−1.5V EOT of 14.6 angstroms.

Formation Of High-K Gate Dielectrics Containing Metal Oxides And Silicates.

This embodiment of the present invention is directed to forming dielectric layers containing metal oxides and silicates. The gate dielectric layer is positioned on a semiconductor wafer in between an oxide-silicon interface and a gate contact material. The gate dielectric formed according to the present invention is particularly well suited for use in small-scale devices.

The present inventors have realized that the interface layer between the silicon MOS channel and the high K dielectric is one of the most critical features for achieving equivalent oxide thickness (EOT) of less than 1 nm. In the past, conventionally a oxide layer was formed between the silicon surface and the gate dielectric. Such oxide layers were either formed intentionally or formed during annealing. For instance, most high-k dielectrics are poor diffusion barriers to oxygen, which will cause an interfacial oxide layer to grow during annealing. The presence of this interfacial oxide layer, however, increases EOT, reducing the effectiveness of the high-k dielectric. Further, any reactions between a high-k dielectric and a silicon substrate during an anneal also increases EOT, generates interface states, degrades mobility, and increases the leakage current significantly.

This embodiment of the present invention is directed to a CMOS device structure having a small EOT. In particular, the present invention makes possible the fabrication of high-k gate dielectrics that are compatible with conventional self-aligned dual-gate poly-Si CMOS, with minimal formation of interfacial oxide layers that degrade device performance and reliability. Devices fabricated according to the present invention have an EOT of less that 1.2 nm with significantly reduced leakage current.

The present invention, in this embodiment, avoids formation of interfacial oxide layers during formation of a high-k gate dielectric as well as the post-deposition annealing by initially in-situ forming an ultra thin passivation layer on a silicon substrate. The ultra thin passivation layer is formed by controllably and briefly exposing a cleaned silicon surface to a nitrogen containing ambient, such as $NH_3$. The layer that is formed has a thickness of less than 5 nm, and particularly less than 1 nm. After forming the passivation layer, deposition of a high-k gate dielectric, such as a metal oxide or a metal silicate, is performed.

The method of the present invention can be used to deposit a high-k metal oxide or silicate coating in which the metal is aluminium, hafnium, tantalum, titanium, zirconium, yttrium, silicon, lanthanum and combinations thereof, and the like. For instance, the method of the present invention can be utilized to deposit a thin coating of a metal oxide, such as aluminum oxide ($Al_2O_3$), tantalum oxide ($Ta_2O_5$), titanium oxide ($TiO_2$), zirconium oxide ($ZrO_2$), hafnium oxide ($HfO_2$), yttrium oxide ($Y_2O_3$), silicon zirconium oxide ($SiZrO_4$), lanthanum oxide ($La_2O_5$), other corresponding silicates, and the like, onto a semiconductor wafer made from silicon. Tantalum oxide, for example, typically forms a coating having a dielectric constant between about 15 to about 30.

To deposit the relatively high-k coating, in this embodiment, the substrate is first cleaned if desired. After being cleaned, a passivation layer is formed on the substrate from a gas containing nitrogen, such as ammonia. A high-k dielectric deposition then occurs on the passivation layer. The high-k dielectric layer is subjected to in-situ annealing in a nitrogen or argon ambient containing controllable amounts of oxygen to improve the dielectric properties. The method produces high-k gate dielectrics with very thin EOT and very high quality.

Figure 3:
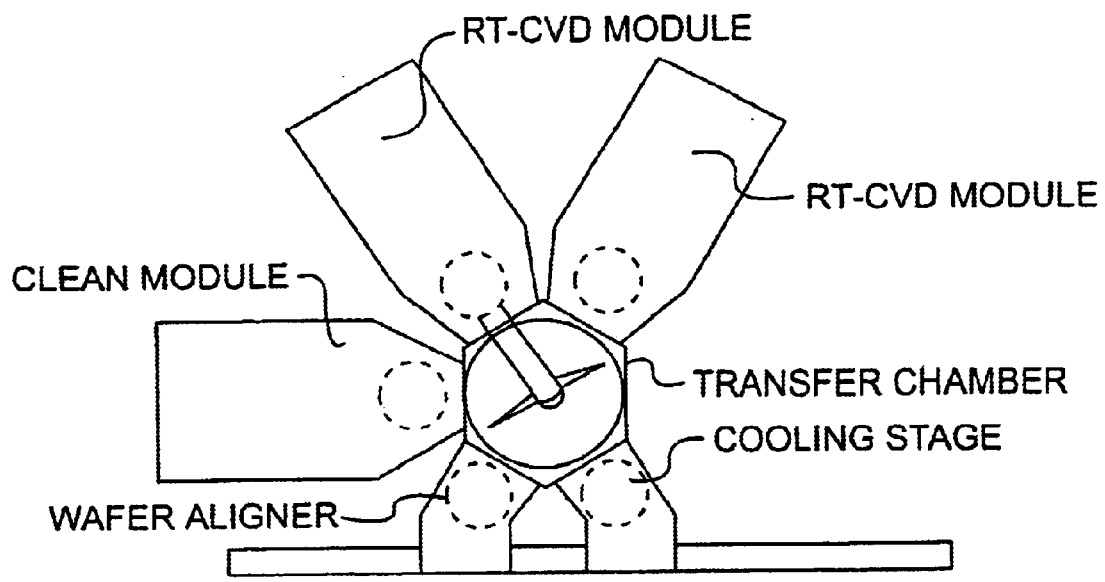
FIG. 3 is a top view of an RT-CVD module that can be used in accordance with the present invention.

In general, any chamber or vessel that is capable of being utilized to deposit a dielectric coating onto a substrate can be utilized to form the dielectric layer. For example, conventional chemical vapor deposition vessels can be adapted for use with the method of the present invention. For example, the system illustrated in FIG. 1 can be used in the manner described above. Alternatively, a cluster tool system can also be used that incorporates rapid thermal processing. One example of a cluster tool is illustrated in FIG. 3.

Figure 4:
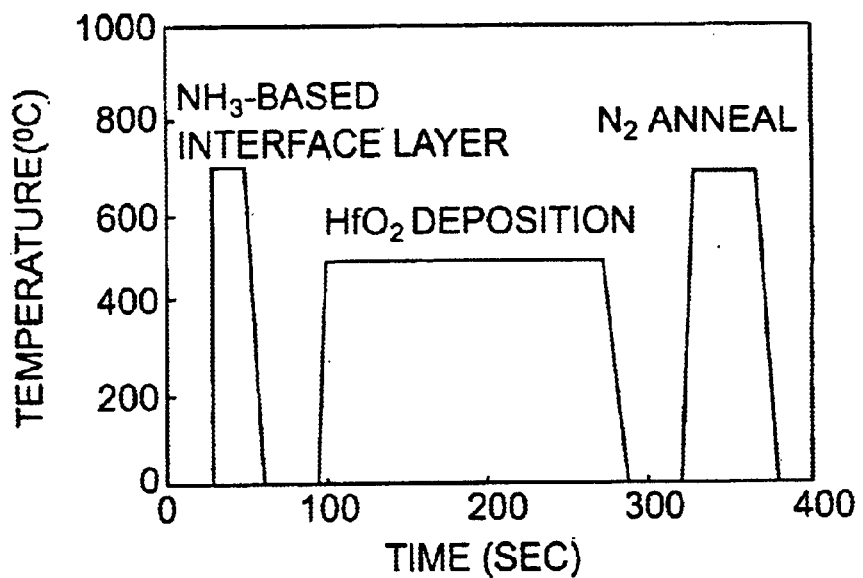
FIG. 4 is a diagram of one embodiment of a method of the present invention.
Figure 5:
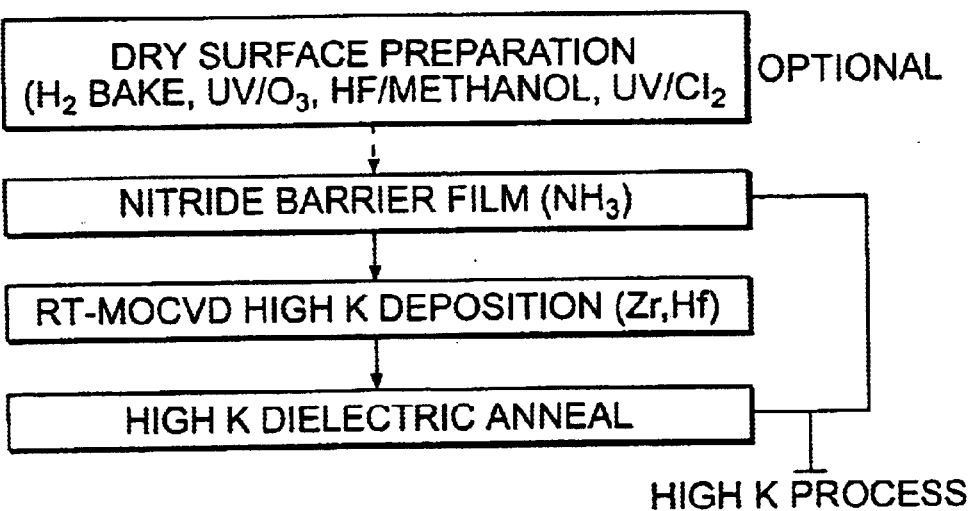
FIG. 5 is a diagram of another embodiment of the method of the present invention.

One embodiment of a process for forming the dielectric layer containing a metal oxide or metal silicate will now be described in greater detail. Embodiments of the process of the present invention are shown schematically in FIGS. 4 and 5. As shown and as discussed above, first a silicon wafer is cleaned. In general, any suitable cleaning process can be used. For example, in one embodiment, the surface of the silicon can be prepared by dipping the substrate in dilute hydrofluoric acid and subsequently rinsing the substrate in deionized water or other solution.

Once the wafer is cleaned, a passivation layer made from a nitride barrier film is then applied to the substrate. The nitride layer is formed by exposing the surface of the wafer to a nitrogen containing ambient, such as to an ambient containing ammonia. The formed nitride layer should be very thin, such as less than 5 nm, and particularly less than 1 nm. For instance, in one embodiment, the substrate can be exposed to ammonia at a temperature of from about 600° C. to about 900° C. for from about 0.1 to about 10 seconds.

Prior to introducing ammonia into the reaction chamber, the base pressure should be in the range of from about 1 to about $1\times10^{-9}$ Torr, with lower base pressures being preferred. Ammonia partial pressure during the passivation layer growth can be in the range of from about 0.1 to about 100 Torr. After the passivation layer is formed, the substrate can be cooled if desired and the ammonia can be evacuated from the processing chamber.

Next, a high-k dielectric layer is formed on the passivation layer. In order to form the high-k dielectric layer, a gas precursor is supplied to the reactor vessel for a certain deposition time period, at a certain flow rate, and at a certain temperature. The gas precursor flow rate can vary, but is typically between about one standard cubic centimeter per minute to about one liter per minute. The gas precursor can be supplied to the reactor vessel either alone or in conjunction with a carrier gas, such as an inert gas (e.g., argon or nitrogen).

In general, a variety of gas precursors can be utilized in the present invention to form a coating having a high dielectric constant "k". In particular, any gas precursor that is capable of forming a high-k coating on the wafer can be utilized in the present invention. For example, some suitable gas precursors include gases that contain aluminum, hafnium, tantalum, titanium, silicon, yttrium, zirconium, combinations thereof, and the like.

In some instances, the vapor of an organo-metallic compound can be used as the precursor. Some examples of such organo-metallic gas precursors include, but are not limited to, tri-1-butylaluminum, aluminum ethoxide, aluminum acetylacetonate, hafnium (IV) t-butoxide, hafnium (IV) ethoxide, tetrabuoxysilane, tetraethoxysilane, pentakis (dimethylamino) tantalum, tantalum ethoxide, tantalum methoxide, tantalum tetraethoxyacetylacetonate, tetrakis (diethylamino) titanium, Titanium t-butoxide, titanium ethoxide, tris (2,2,6,6-tetramethyl-3,5-hepanedionato) titanium, tris[N,N-bis(trimethylsilyl)amide]yttrium, tris(2, 26,6-tetramethyl-3,5-heptanedionato)zirconium, bit (cyclopentadienyl)dimethylzirconium, and the like.

When utilized in accordance with the present invention, an organo-metallic precursor, such as described above, can form one or more metal oxide layers on the wafer substrate.

During deposition of the metal oxide or silicate, the temperature can be from about 400° C. to about 800° C. The deposition can occur for a duration of from about 0.1 to about 100 seconds. The partial pressure during deposition can be in the range of from about 0.1 to about 100 Torr.

After deposition of the high-k dielectric layer, any remaining gas precursor can be removed from the chamber. A post-deposition anneal is then carried out. The anneal can occur in the same chamber or the wafer can be moved to an RTP module.

The processing conditions for the post-deposition anneal include temperatures of between about 400° C. to about 900° C. for a duration of from about 0.1 to about 100 seconds. The anneal is carried out with an ambient of molecular nitrogen or argon or their mixtures with an oxygen containing gas, such as NO, $N_2O$, and $O_2$. The pressure in the chamber can be from about 0.1 to about 700 Torr.

During the process, it is desirable that the reaction vessel or vessels be capable -of maintaining very high vacuums, such as from $10^{-9}$ to $10^{-3}$ Torr, to ensure that no oxygen is introduced to the chamber in order to control the interface. Through this process, a layer is formed having a very low EOT and very low leakage current. For instance, gate stacks can be fabricated that have an EOT of about 7.87 anstroms with a leakage current of $5\times10^{-4}$ A/cm$^2$@$V_g$=−1V.

EXAMPLES

Example 1

The scaling down of Complementary Metal Oxide Semiconductor (CMOS) devices has increased the demand for gate dielectrics with a higher dielectric constant than silicon dioxide. This is necessary to reach ultra thin oxide equivalent thickness (<20 Å) without compromising gate leakage current. The following experiments were conducted to study the use of the $Si_3N_4/SiO_2$ stack for gate dielectric applications. The physical properties studied were roughness, nitrogen content, and physical thickness. Electrical properties on capacitors and transistors were also studied.

NMOS capacitors were fabricated on p-type epi silicon wafers using LOCOS isolation. PMOS capacitors were fabricated, as well, to verify the boron penetration suppression. The silicon dioxide/nitride gate stack was produced using the Integrapro®—Rapid Thermal CVD Cluster Tool marketed by the Assignee of the present invention.

First, the wafer was oxidized in the RT-CVD chamber in NO ambient at 800° C. for 10 seconds. Then, 20 Å of silicon nitride was deposited with $NH_3$ and $SiH_4$ at 700 to 800° C. for 25 to 50 seconds. After the CVD nitride deposition, the samples were annealed in an $NH_3$ ambient followed by an $N_2O$ ambient at 700 to 900° C. for 30 seconds. Table 1 shows the process conditions for each process step. The samples were then transferred to an LPCVD furnace for polysilicon deposition and $POCL_5$ doping. In the case of OMOS wafers, boron ion implant was performed using $BH_3$ followed by an RTP anneal.

TABLE I

| | Process conditions | | | |
|---|---|---|---|---|
| I-NO Oxidation | II-CVD SiN | | IV-NH$_3$ Anneal | V-N$_2$O Anneal |
| Temp (° C.) | Time [sec] | Temp (° C.) | Temp (° C.) | Temp (° C.) |
| 800 | 25 | 800 | 700–900 | 700–900 |

Dielectric Constant—equation (1) calculates the dielectric constant for the oxidized nitride:

$$\epsilon\_actual=(x/EOT)*\epsilon\_SiO_2 \quad (1)$$

Where:
X=Physical thickness
EOT=electrical oxide thickness including QM effects and poly depletion effects
$\epsilon\_SiO_2$=dielectric constant $SiO_2$ (3.9).

Figure 6:
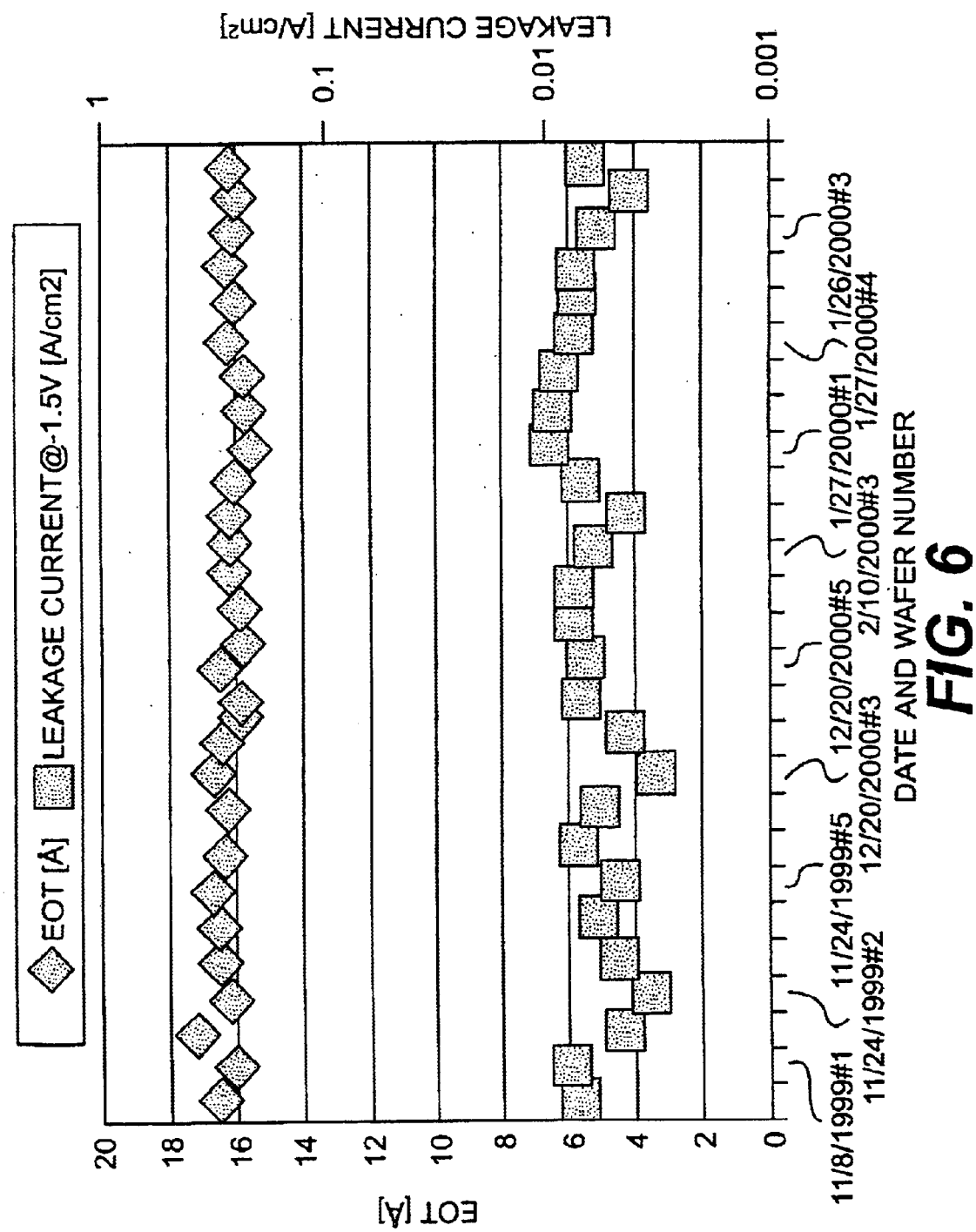
FIGS. 6-23 are graphs illustrating the results obtained in Example 1.

Physical thickness, for use in equation (1), was evaluated with TEM to be 23 Å. EOT, including the QM effects and poly depletion effects, as shown in FIG. 6 was obtained over a 5 month period. Oxide equivalent thickness was extracted from the C-V measurement on the capacitor structures.

Comparing the electrical oxide thickness to the physical thickness by using equation (1) results in a dielectric constant of 5.6, which is 1.45 times higher than the thermal oxide dielectric constant.

Figure 7:
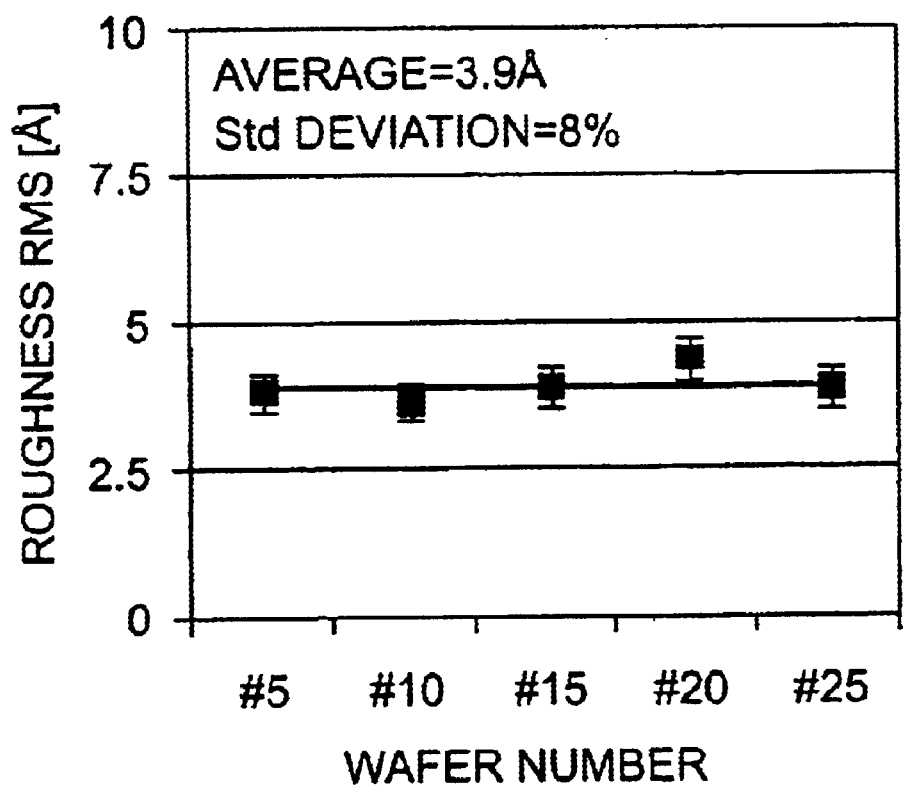

Reducing the film roughness maintains good electrical properties of low leakage current, high charge to break down, and high reliability. Roughness repeatability was confirmed in order to check for the validity of the results. FIG. 7 represents the roughness repeatability for CVD at a deposition temperature of 750° C. The resulting standard deviation for wafer to wafer is 8%.

Figure 8:
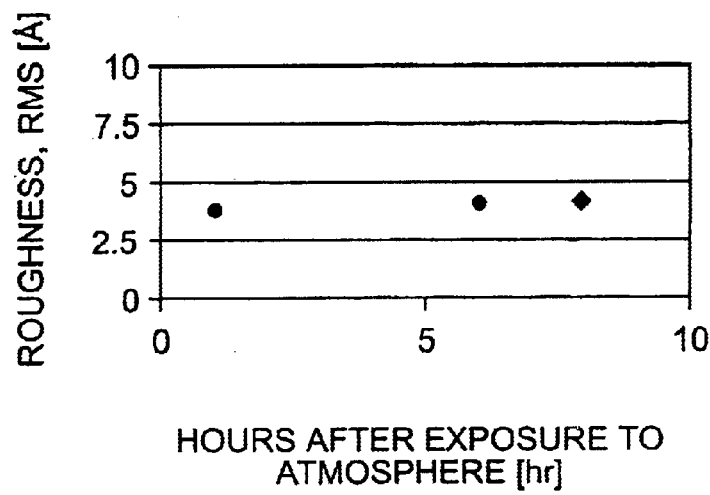

Nitride films were examined using ex-situ analysis. The staging time of the film prior to the analysis was checked to determine if it had any influence on the measured results. As seen in FIG. 8, there are no significant changes in roughness due to staging the samples.

Figure 9:
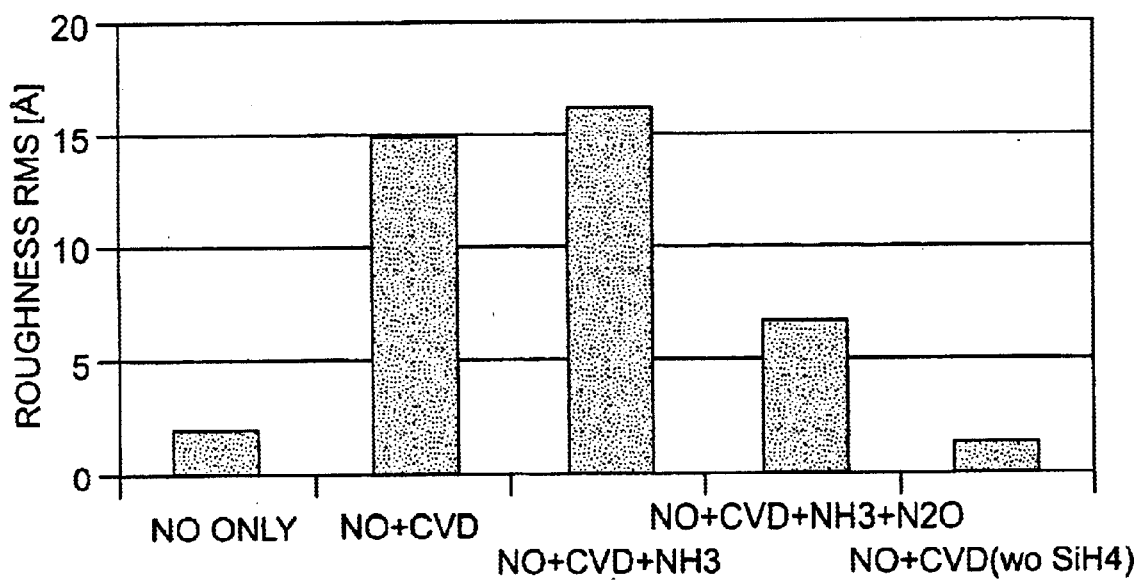

After each process step, the roughness was analyzed for that step influence on the total film's micro roughness as seen in FIG. 9.

When looking at FIG. 9, one can see that the first oxidation step does not contribute significantly to the film roughness. The CVD step is the main source of the film roughness.

Figure 10:
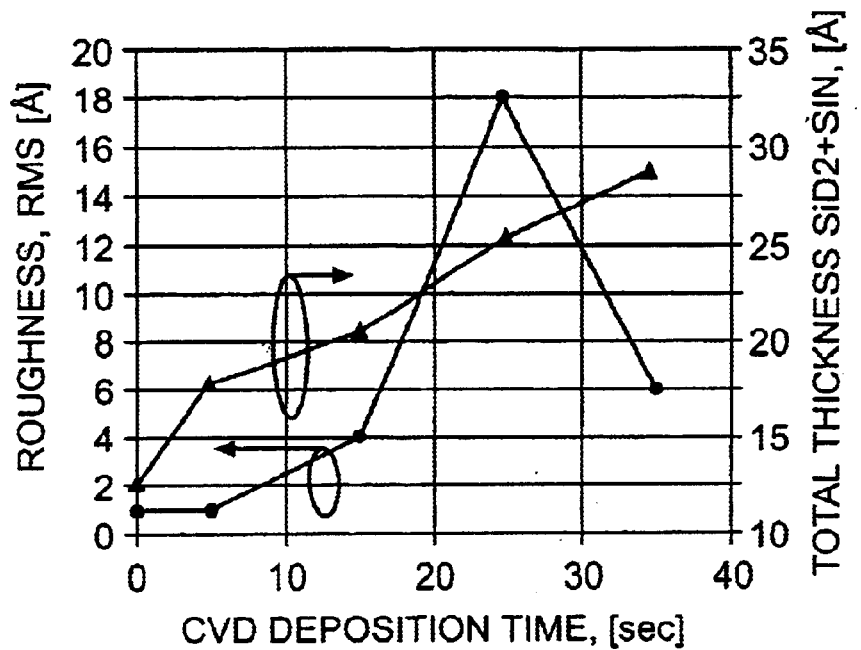

The roughness of the CVD step was further investigated by looking at the time dependency (FIG. 10). The wafer processing included NO oxidation followed by CVD nitride deposition; there were no anneals.

Figure 11:
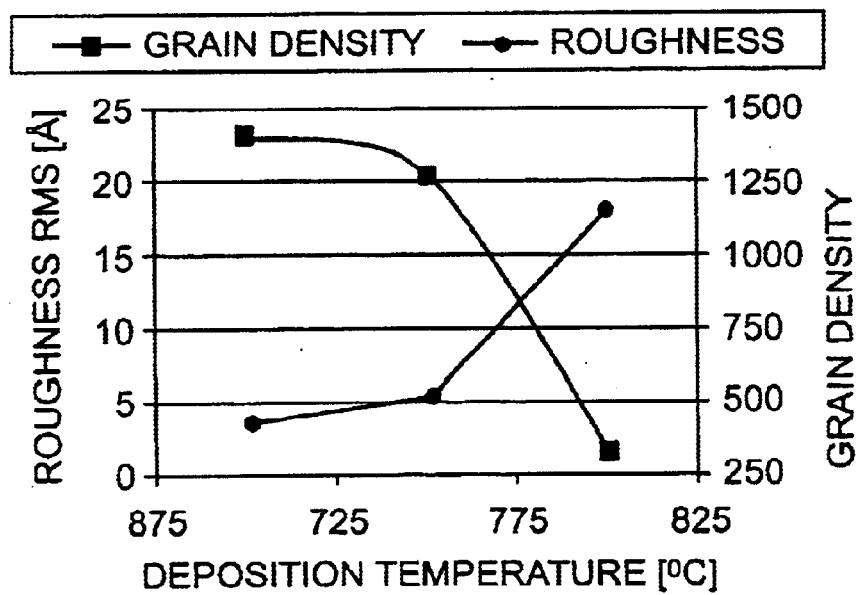

CVD temperature is also an important factor in controlling the film roughness. In FIG. 11, films of the same thickness were compared for surface roughness at different deposition temperatures. The deposition time was adjusted in order to achieve the same thickness.

An AFM image was taken at an early stage of the silicon nitride film growth at two different temperatures. The AFM images showed the trend that higher temperature will result in increased roughness. In addition, the AFM image reveals different grain sizes. The grains are much larger at higher temperature. At higher temperatures, the atoms on the surface have an extended diffusion length and will migrate to lower energy sites forming larger grains. With the increased diffusion length, the physorbed atoms are more likely to attach to an existing cluster than to form a new one. The results are smaller grain density and larger size.

Figure 12:
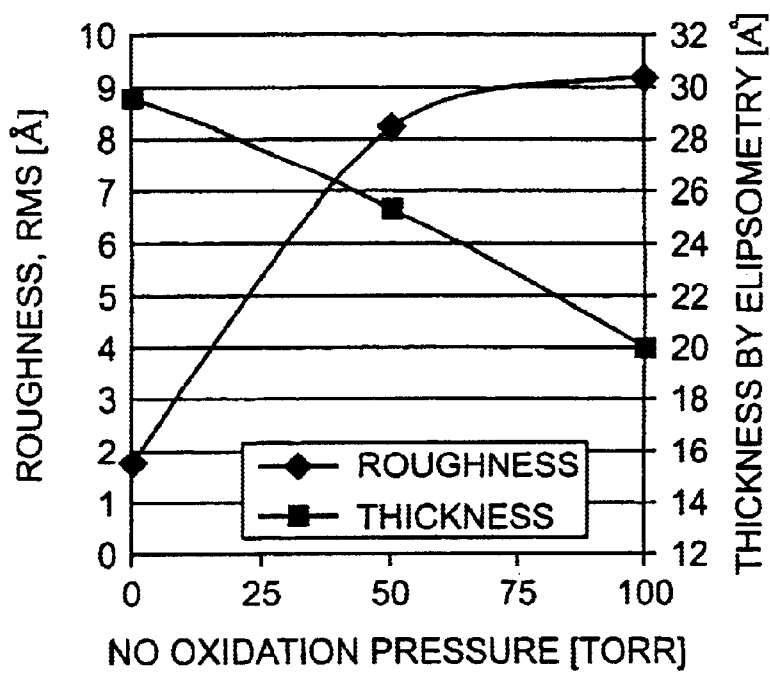

FIG. 12 shows the resulting CVD film micro roughness as deposited on different oxide films. The oxides were grown at different pressures while the CVD deposition parameters were held constant. Thinner oxides reduced the micro roughness of the CVD nitride. As the NO pressure is reduced, the oxide thickness decreases. In this thickness regime (6 Å–9 Å), the oxide is thin enough to exhibit different surface dangling bond densities as a function of its thickness. The interface between Si to $SiO_2$ has a width of 5 Å (2ML). If dangling bond density is high, the islands formed during the early stage of film growth are smaller and closer. This will lead to films with lower micro roughness.

Figure 13:
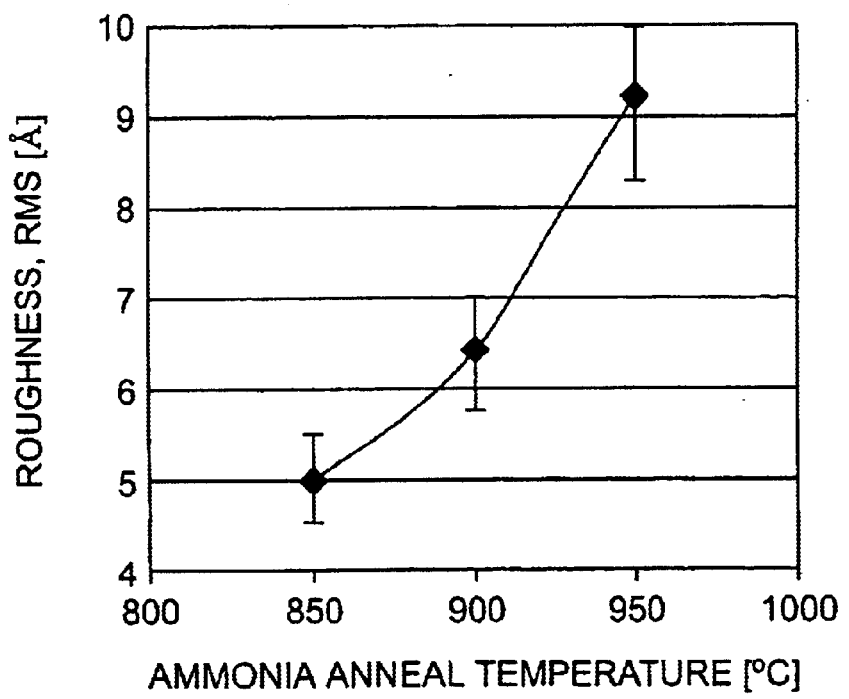

Film roughness with different $NH_3$ annealing conditions were examined next by varying different temperatures. An increase in the ammonia anneal temperature will result in film roughness increase as seen in FIG. 13.

Finally, the effect of the $N_2O$ anneal on the film micro roughness was investigated. It was found that increasing the $N_2O$ anneal temperature resulted in lower film micro roughness. At approximately 750° C., there is a large transition in film micro roughness. This temperature is believed to be a transition temperature where the film viscosity is reduced that allows the film to flow. It is important to note that as the ammonia annealing temperature is increased the film micro roughness increases (FIG. 13). Whereas, for the $N_2O$ anneal, the resulting trend is the opposite. Films with less rigid molecular network will exhibit lower viscosity. The O—Si—O network has a larger degree of freedom than the Si—O—N network. Under an oxidizing ambient, N2O, the film will have increased oxygen content and as a result, the molecular network will be less rigid. Film flow will be easier and the result will be reduced roughness. In addition, the ammonia anneal is primarily reacting on film sites which have a high silicon to nitrogen ratio. As it reacts selectively, it is believed to increase the roughness.

Figure 14:
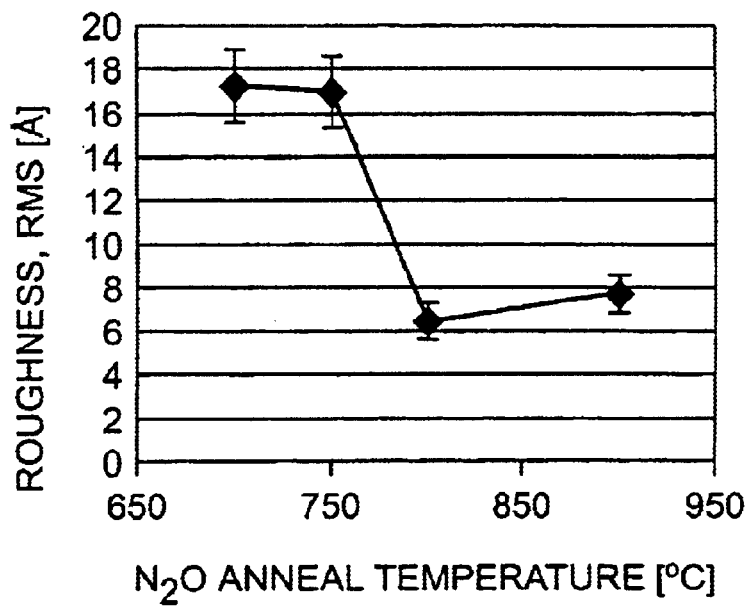

FIG. 14 shows this viscosity effect and the resulting abrupt decrease in film micro roughness.

The fundamental limit to the scaling of thin $SiO_2$ is the large leakage current due to direct tunneling. Using a silicon nitride/oxide stack, which has a higher dielectric constant, should reduce direct tunneling by being a physically thicker film while maintaining the same capacitance. The dielectric constant of the oxide/nitride layer increases monotonically with increasing nitrogen concentration.

The material composition of the film was characterized using XPS. Film physical thickness was also examined with XPS to yield good correlation with the TEMs. The absolute nitrogen content as determined by the XPS measurements is underestimated. This can be seen when comparing the dielectric constant which is 5.4 when measured with combination of TEM and C-V curve, versus 4.9 when calculated with nitrogen content measured by XPS. The XPS measurements are only relative.

Figure 15:
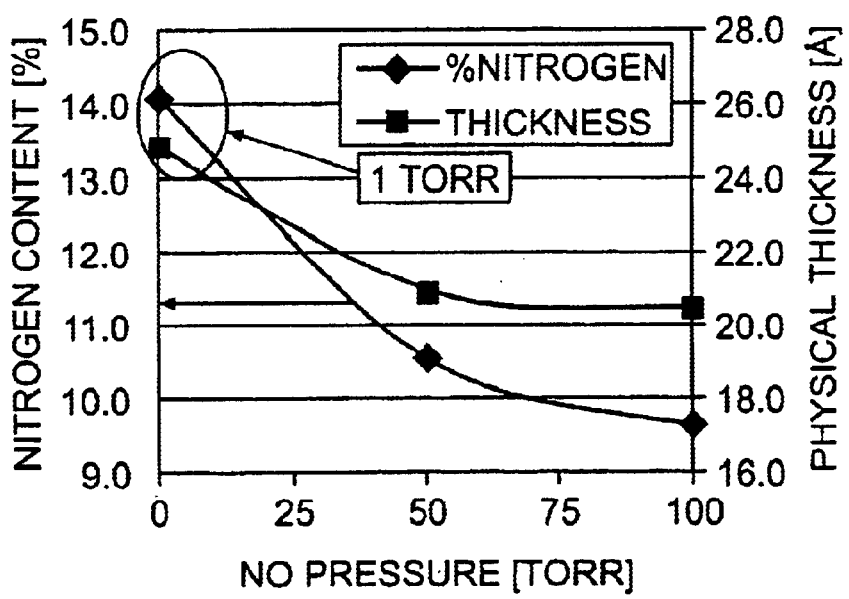

The first experiment was to determine the effect of pressure in the NO oxidation step. FIG. 15 shows the resulting film composition and thickness. As the oxidation pressure was increased from 1 to 100 Torr, the nitrogen content is decreased from 14.2 to 9.5%.

Figure 16:
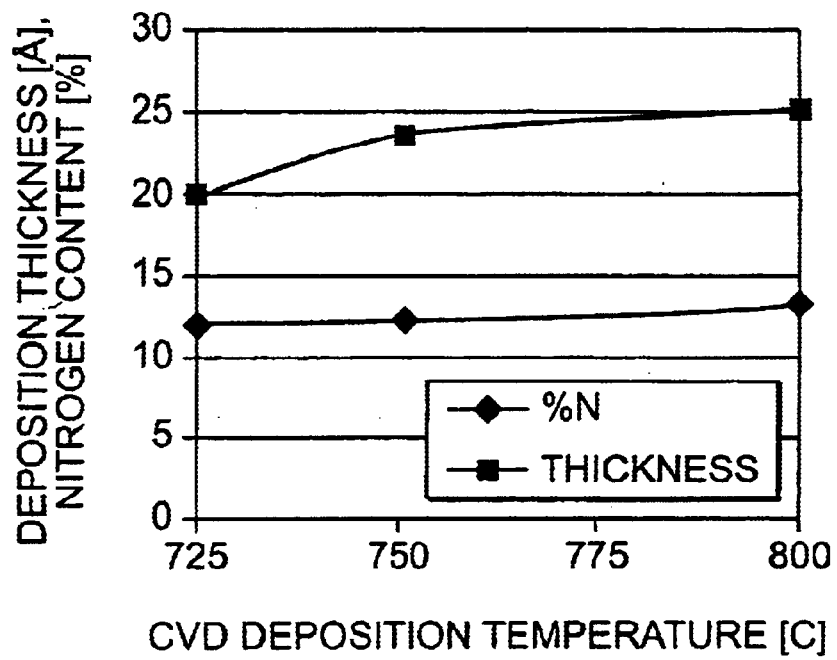

The nitride deposition step was examined by varying the deposition temperature. FIG. 16 shows the nitrogen content and the physical thickness. The experimental results indicate that the nitrogen content does not change significantly by changing the deposition temperature. However, as the deposition temperature is increased physical thickness increases.

Figure 17:
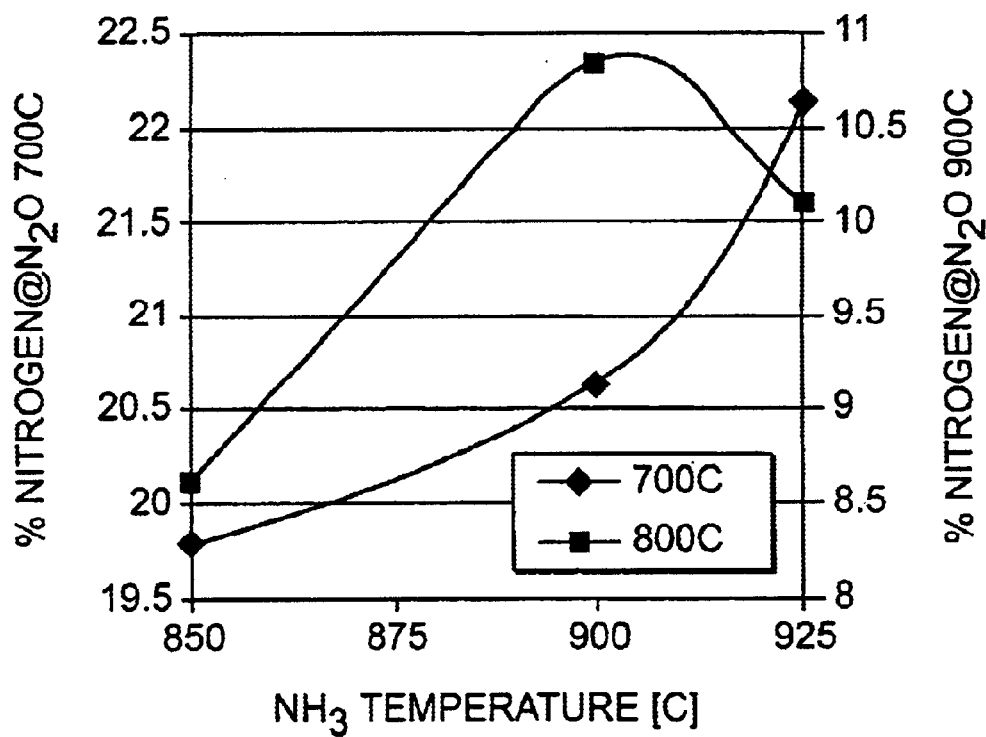

Next, the ammonia step was examined. FIG. 17 shows the nitrogen content with different ammonia annealing temperatures.

Figure 18:
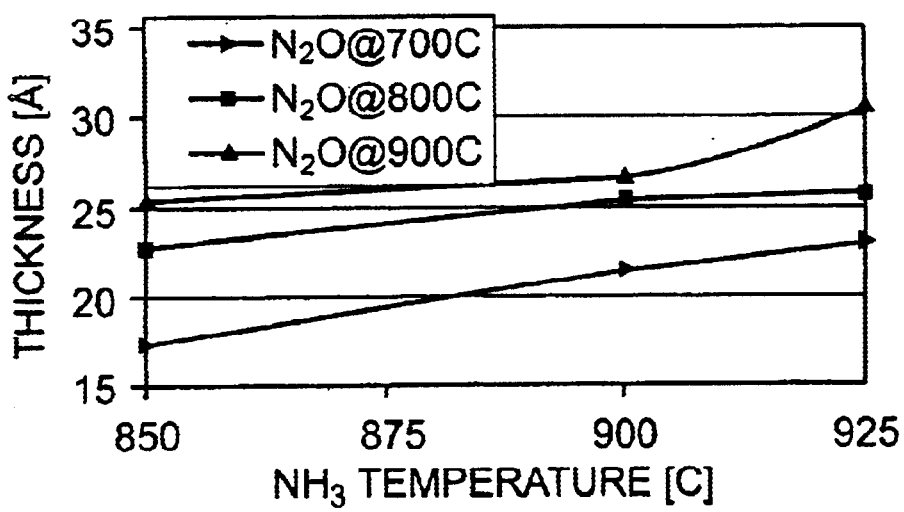

The physical thickness can be seen in FIG. 18. As the ammonia temperature is increased, the thickness increases.

Next. The nitrogen content as function of $N_2O$ annealing temperature was examined. Nitrogen depletion increases with $N_2O$ temperature. Atomic oxygen is produced by $N_2O$ during decomposition in thermal systems with shorter residence time.

$$N_2O \rightarrow N_2 + O^* + \Delta H = 38.3 \text{ kcal/mol} \qquad (2)$$

Figure 19:
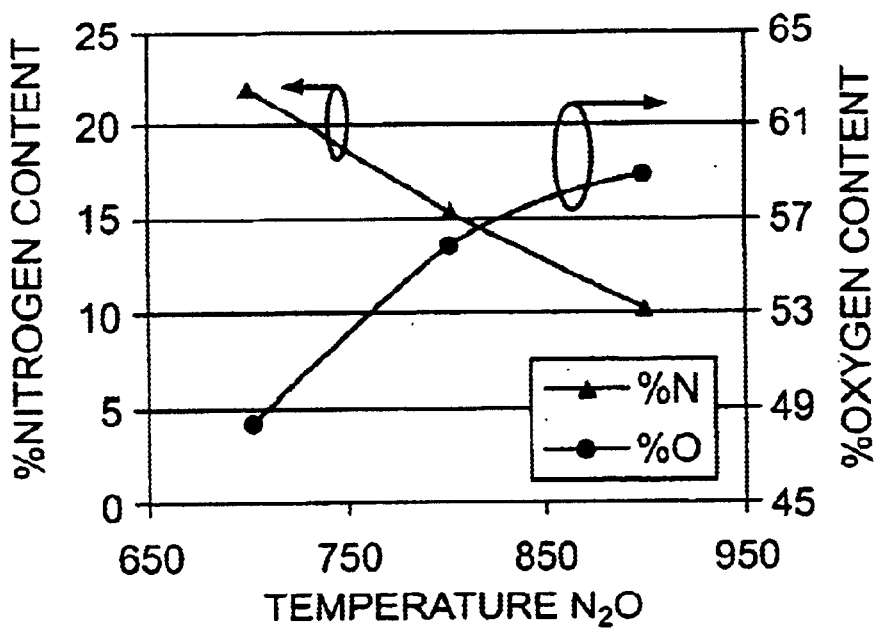
Figure 20:
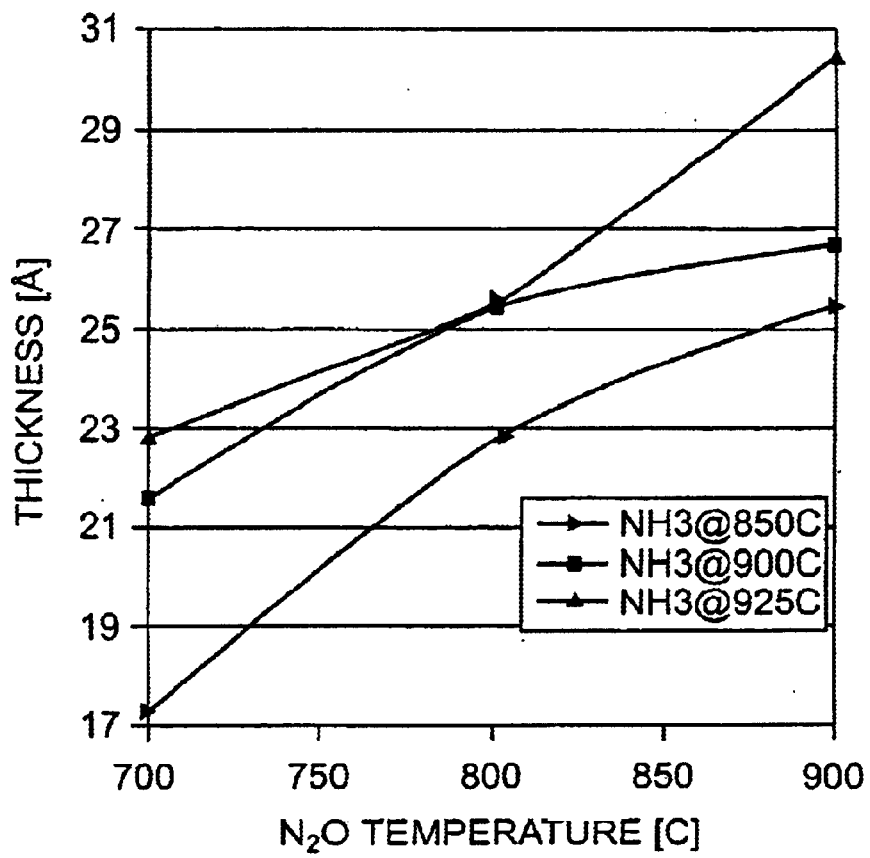

The atomic oxygen reacts with the [—$NH_2$] and [—NH] as part of the Si—$NH_2$, Si=NH groups. The atomic oxygen replaces the [—$NH_2$] and [=NH] in the bulk of the film. The result will be a reduction of the hydrogen and nitrogen content in the film as seen in FIG. 19.

Finally we examined film thickness as a function of $N_2O$ annealing temperature as seen in FIG. 18.

Figure 22:
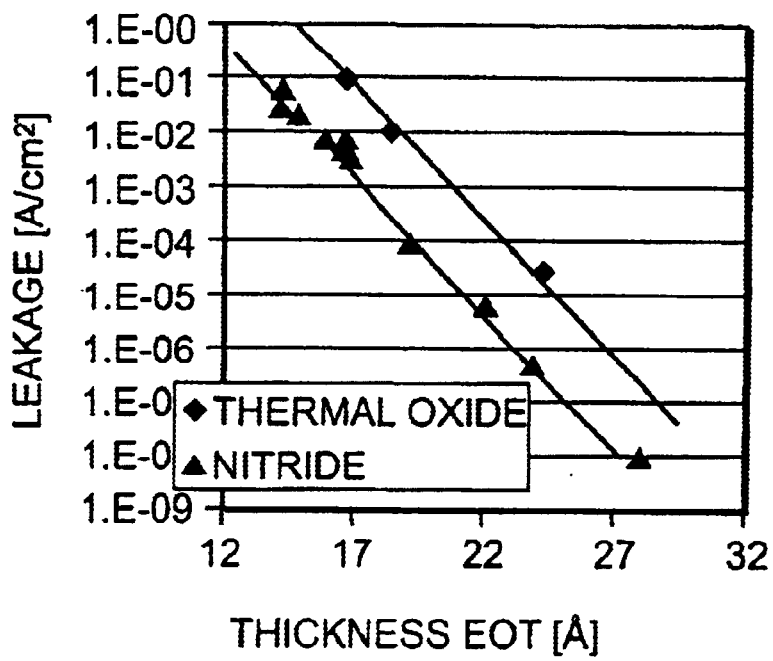

The oxide equivalent thickness was extracted from the C-V plot. Gate leakage current was also measured. The results are plotted on a master curve as seen in FIG. 22. The master curve is used as a reference for new process conditions. A normalized current density is defined by equation 3:

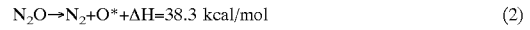
Leakage ratio=Ig_measured (EOT=x)/Ig_mastr_plt(EOT=x)  (3)

Where:

Ig_measured =the measured leakage current at accumulation (−2.5V on NMOS capacitor) where the measured film has EOT of x as determined from the C-V curve.

Ig_mstr_-plt(EOT=x)=the expected leakage current from nitride curve in FIG. 22 at EOT of x.

The current transport mechanism is predominantly DT tunneling at low fields and FN in higher fields. As a result of this current transport mechanism, an exponential function is expected when plotting leakage current versus EOT as seen in equation (4). Equation (4) is the tunneling probability for a single layer dielectric.

$$P(Veff, EOT) = \exp[-2 \cdot EOT \cdot a \cdot (m_e \cdot \{E_b - V_{beff}\})^{0.5}] \qquad (4)$$

Figure 21:
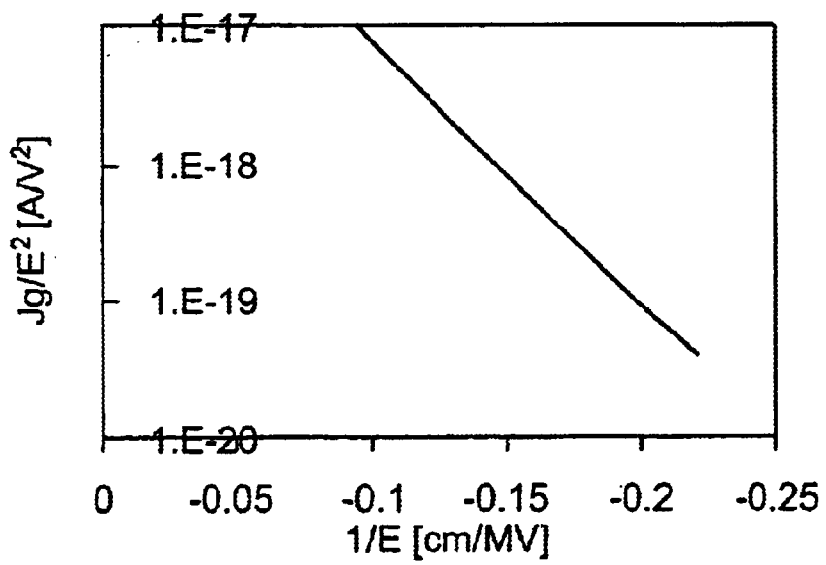

Where:
a-=a constant
$m_e$-=Electron tunneling mass
Eb-=Effective uniform barrier height for Tunneling To verify that the film has low defect density and can be extrapolated by the RN tunneling equation, a FN function was plotted (FIG. 21). The nitride film exhibits FN tunneling mechanism.

A large DOE was performed with an objective to achieve minimal leakage current and EOT. We optimized the process to achieve a film which has an EOT of 14.5 Å and gate leakage current which is close to two orders of magnitude better than oxide, as seen in FIG. 22.

Optimizing the saturation current is a key issue for transistors. A range of parameters were examined to find the dominating influence. The data was normalized by extracting the carrier mobility, and comparing this result to silicon dioxide:

$$\mu_{Normalized} = \mu_{Si3N4peak}(E)/\mu_{Sio2}(E)$$

Where:

$\mu_{Si3N4peak}(E)$=the oxide/nitride peak mobility extracted from measured data (C-V and Id-Vg) at electric field, E.

$\mu_{Sio2}(E)$=oxide universal mobility at electric field E.

Figure 23:
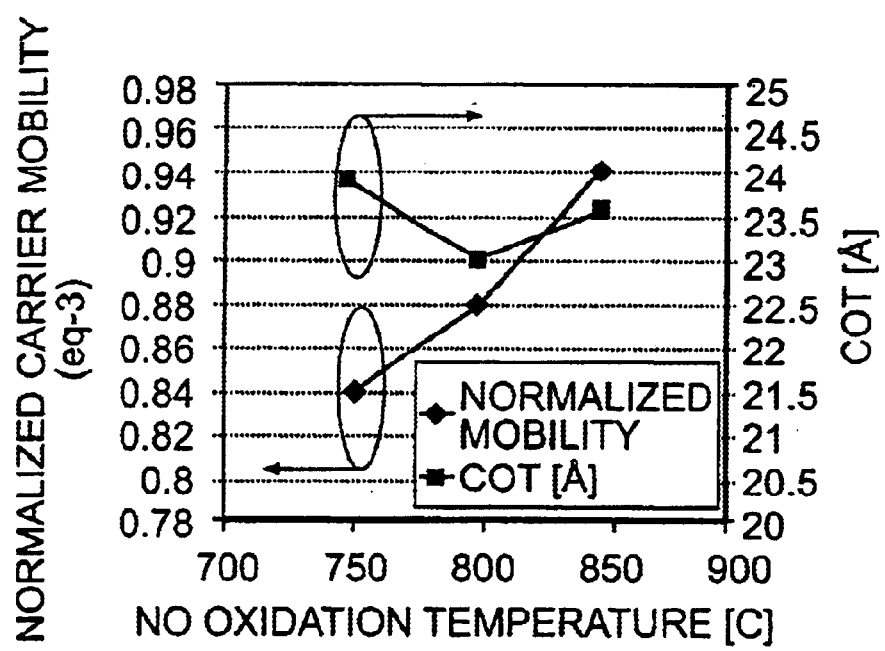

Analyzing the mobility data versus electrical field, using Matthiessen's rule, revealed that the main source of mobility degradation is coulomb scattering. Thus, EOT does not change significantly when increasing NO temperature and it is therefore desirable to use NO higher temperature in order to achieve higher carrier mobility (see FIG. 23).

SUMMARY

Atomic Force Microscopy (AFM) was used to characterize the roughness resulting from the island growth throughout the process. First, the oxide was measured and found to be very smooth with a RMS of 1.4 Å. After the silicon nitride deposition, the roughness was increased. It was found that thinner the NO oxynitride, the smoother the silicon nitride is deposited. Thinner NO Oxide resulted in thicker CVD nitride. Reducing CVD temperature also decreased the silicon nitride roughness. The $NH_3$ annealing following the CVD nitride deposition increased the roughness due to the nitration of the non-homogenous film. Finally the $N_2O$ anneal reduced the roughness significantly.

XPS was used to estimate the nitrogen, oxygen, and silicon content of the film. It was found that increasing $N_2O$ temperature reduces nitrogen content while increasing $NH_3$ temperature increases the nitrogen content.

TEM and XPS were used to study the physical thickness of the film. The XPS was used for physical thickness measurement after correlation with TEM was established. Physical thickness was found to increase when increasing annealing temperatures.

Capacitor structures were used to optimize the EOT and the leakage. We improved the EOT and leakage by reducing the CVD temperature and optimizing the anneals.

Transistor structures were used to analyzed the positive charge and the saturation current.

Excellent leakage current of 4 e-3A/cm$^2$ at −1.5V EOT of 14.6 Å with good mobility have been demonstrated on transistor structures.

Example 2

A p-type Si (100) substrate was used in this example. The substrate was doped with boron to a resistivity of 0.02 ohms-cm. An epitaxial Si layer was grown on the substrate with a resistivity of 10 ohms-cm. Prior to film depositions, the substrate was dipped in dilute HF for 30 seconds, and rinsed in deionized water. The substrate was placed in an RT-CVD chamber, which was then evacuated to a pressure of 10-4 Torr, and filled with NH3 gas to a pressure of 1-10 Torr. The substrate was heated to 700-800° C. to form an oxynitride passivation layer. The substrate was then exposed to rapid thermal MOCVD using Hafnium Tertiarybutoxide ($C_{16}H_{36}O_4Hf$) for the Hf precursor in a carrier gas of $N_2$ at 50 sccm and $O_2$ with a partial pressure of 5 Torr, at 400-700° C. for 10 seconds. Devices with gate areas ranging from 5×10$^{-5}$ cm2 to 10$^{-3}$ cm$^2$ were patterned. Al/TiN and polySi were used as gate electrodes.

Figure 24:
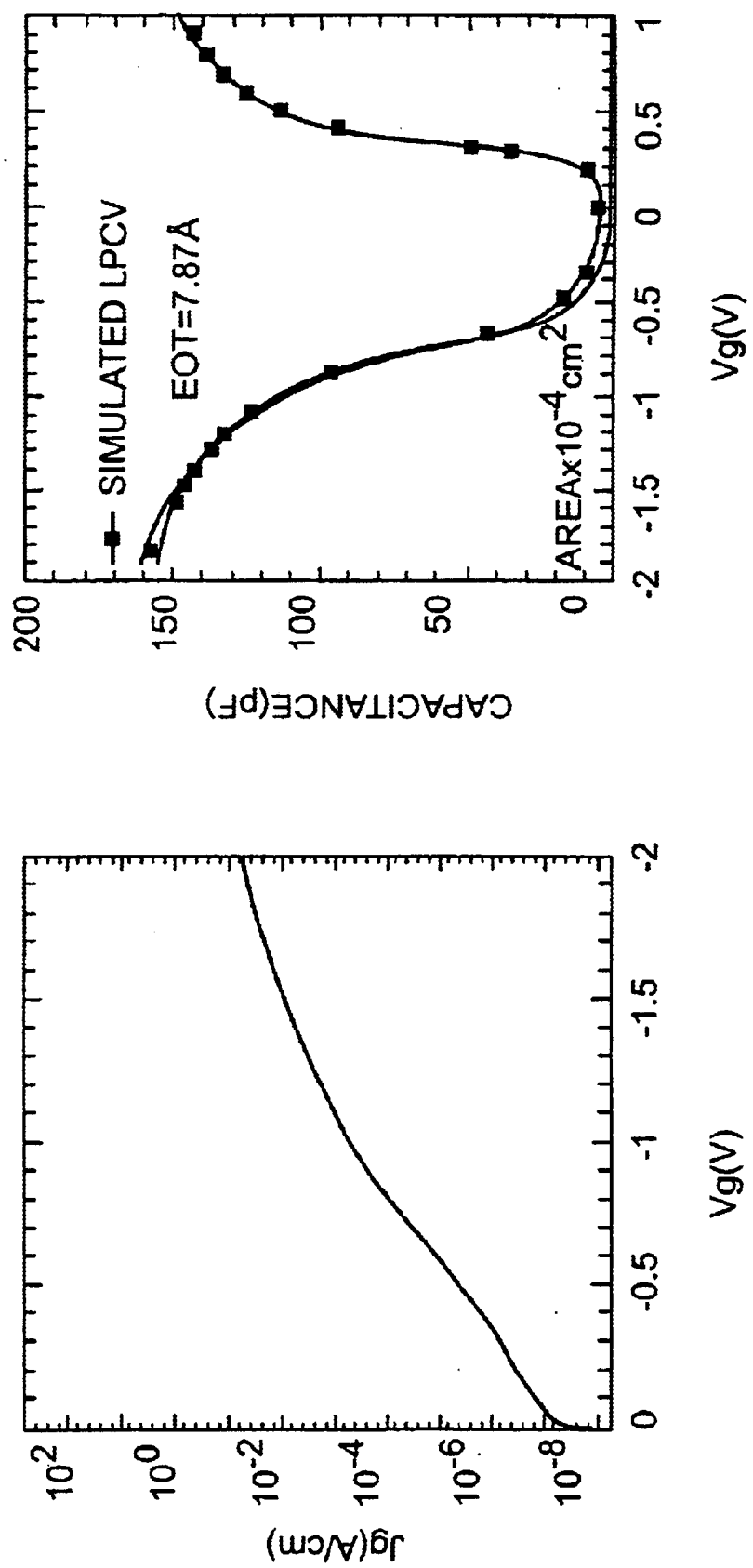
FIG. 24 are graphs illustrating the results obtained in Example 2 below.

Electrical characteristics of the devices were measured as a function of gate voltage. FIG. 24 shows the HfO$_2$ gate stack fabricated with this method yields EOT=7.87Å with excellent leakage current (Jg=5×10$^{-4}$A/cm$^2$@V$_g$=−1V). The present invention is not limited by the specific embodiments described herein. Many potential high-K gate dielectrics may benefit from this in-situ RTCVD method.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A method for depositing a dielectric coating onto a substrate comprising:
   i) providing a system comprising a reactor vessel adapted to contain the substrate and an energy source in communication with said reactor vessel for heating the substrate contained in said vessel; and
   ii) forming a film on said substrate, said film being formed according to a method comprising:
      a) heating the substrate with said energy source;
      b) supplying to said reactor vessel an oxide gas while the substrate is being heated, said oxide gas comprising a compound that contains at least one nitrogen atom such that said oxide gas reacts with said substrate to form an oxynitride layer on said substrate, said formed layer having a thickness of less than 10 angstroms;
      c) depositing a nitride layer on said oxynitride layer, said deposition occurring at a temperature less than about 750° C.;
      d) annealing said nitride layer in the presence of a nitridation annealing gas; and
      e) annealing said nitride layer in the presence of an oxide annealing gas at a temperature greater than about 770° C.

2. A method as defined in claim 1, wherein said film has a dielectric constant between about 4 to about 80.

3. A method as defined in claim 1, wherein said nitrogen-containing compound comprises NO.

4. A method as defined in claim 1, wherein said nitride layer is formed by supplying a first gas precursor and a second gas precursor to said reactor vessel, said first gas precursor comprising a compound that contains at least one silicon atom and said second gas precursor comprising a compound that contains at least one nitrogen atom.

5. A method as defined in claim 4, wherein said first gas precursor comprises $SiH_4$.

6. A method as defined in claim 4, wherein said second gas precursor comprises $NH_3$.

7. A method as defined in claim 1, wherein the substrate is a semiconductor wafer that comprises silicon.

8. A method as defined in claim 1, wherein said oxynitride layer is formed in an atmosphere having a pressure of less than 50 Torr.

9. A method as defined in claim 1, wherein said nitride layer has a thickness of less than 25 angstroms.

10. A method as defined in claim 1, wherein said nitridation annealing gas is ammonia.

11. A method as defined in claim 1, wherein said oxide annealing gas is $N_2O$.

12. A method as defined in claim 10, wherein annealing said nitride layer in the presence of said nitridation annealing gas is conducted at a temperature of from about 875° C. to about 925° C.

13. A method for depositing a dielectric coating onto a substrate comprising:

heating a semiconductor wafer comprising silicon in the presence of an oxide gas, said oxide gas comprising NO, said oxide gas reacting with said semiconductor wafer to form an oxynitride layer on said wafer, said oxynitride layer being formed at a temperature, at a pressure, and for a time sufficient to form a layer having a thickness of less than about 10 angstroms;

subsequently heating said semiconductor wafer in the presence of a first gas precursor and a second gas precursor to form a nitride layer on said oxynitride layer, said first gas precursor comprising $SiH_4$, said second gas precursor comprising ammonia, said nitride layer being formed at a temperature of less than about 750° C., said nitride layer having a thickness of less than about 25 angstroms; annealing said nitride layer in the presence of ammonia; and thereafter annealing said nitride layer in the presence of $N_2O$ at a temperature of at least 770° C.

14. A method as defined in claim 13, wherein said nitride layer is annealed in the presence of said ammonia at a temperature of from about 875° C. to about 925° C.

15. A method as defined in claim 13, further comprising the step of depositing a polysilicon layer on top of said nitride layer.

16. A method as defined in claim 13, further comprising the step of incorporating said dielectric coating into a capacitor.

17. A method as defined in claim 13, further comprising the step of incorporating said dielectric coating into a transistor.

18. A method for forming a dielectric coating on a semiconductor wafer comprising:

heating a wafer comprising silica in the presence of a gas containing nitrogen to form a passivation layer on said wafer;

subsequently heating said wafer in the presence of a gas precursor, said gas precursor forming a dielectric layer comprising a metal oxide or a silicate on said wafer, said dielectric layer being formed at a temperature of greater than about 300° C.; and annealing said dielectric layer in the presence of an annealing gas, said annealing gas comprising an inert gas and an oxygen containing gas.

19. A method as defined in claim 18, wherein said passivation layer has a thickness of less than about 5 nanometers.

20. A method as defined in claim 18, wherein said gas containing nitrogen that is used to form said passivation layer comprises ammonia.

21. A method as defined in claim 20, wherein said passivation layer is formed in less than about 10 seconds at a temperature of from about 600 to about 900° C.

22. A method as defined in claim 20, wherein the partial pressure of said ammonia during formation of said passivation layer is less than about 100 Torr.

23. A method as defined in claim 18, wherein said dielectric layer is formed at a temperature of from about 400 to about 800° C. and wherein, during formation of said passivation layer, said gas precursor has a partial pressure of less than 100 Torr.

24. A method as defined in claim 18, wherein said dielectric layer is annealed at a temperature of from about 400° C. to about 900° C.

25. A method as defined in claim 18, wherein said oxygen containing gas present during said annealing step comprises NO, $N_2O$, $O_2$, or mixtures thereof.

26. A method as defined in claim 25, wherein said inert gas comprises nitrogen, argon, or mixtures thereof.

27. A method as defined in claim 18, wherein said dielectric layer comprises:

$HfO_2$, $ZrO_2$, $Al_2O_3$, $Ta_2O_5$, $La_2O_5$, or their silicates.

28. A dielectric coating on a semiconductor wafer comprising:

a semiconductor wafer comprising silica;

a passivation layer deposited on said semiconductor wafer, said passivation layer formed by reacting ammonia with a surface of said semiconductor wafer;

a dielectric layer formed on said passivation layer, said dielectric layer comprising a metal oxide or a silicate; and wherein said dielectric layer has been annealed in the presence of an oxygen containing gas.

29. A dielectric coating as defined in claim 28, wherein said passivation layer has a thickness of less than 5 nanometers.

30. A dielectric coating as defined in claim 28, wherein said dielectric layer comprises a material selected from the group consisting of $HfO_2$, $ZrO_2$, $Al_2O_3$, $Ta_2O_5$, $La_2O_5$, or their silicates.

31. A dielectric coating as defined in claim 28, wherein said coating as an EOT of less than 1.2 nanometers.

32. A dielectric coating as defined in claim 28, wherein said passivation layer has a thickness of less than 1 nanometer.

33. A dielectric coating as defined in claim 28, wherein said dielectric layer comprises $HfO_2$.

* * * * *